United States Patent [19]

Müller

[11] 3,757,143

[45] Sept. 4, 1973

[54] BISTABLE CONTROLLABLE FLIP-FLOP CIRCUIT

[75] Inventor: Albert Müller, Uster, Switzerland

[73] Assignee: Contraves AG, Zurich, Switzerland

[22] Filed: Apr. 17, 1972

[21] Appl. No.: 244,838

[30] Foreign Application Priority Data

Oct. 22, 1971 Switzerland .................. 15392/71

[52] U.S. Cl. .................. 307/291, 307/308, 328/196, 328/206

[51] Int. Cl. .................. H03k 3/286

[58] Field of Search .................. 307/291, 308; 328/196, 206, 200

[56] References Cited

UNITED STATES PATENTS 3,518,536 6/1970 Lee et al. .................. 307/291 X

*Primary Examiner*—John Zazworsky
*Attorney*—Werner W. Kleeman

[57] ABSTRACT

A bistable controllable flip-flop circuit arrangement comprising two amplifier means and a respective direct current-coupling path for connecting the output of each amplifier means with the input of the amplifier means in such a manner that in each of two possible operating conditions one amplifier means assumes an active amplifying state and the other amplifier means assumes an inactive non-amplifying state. There is also provided a respective alternating current-feedback path for each of the amplifier means, each such alternating current-feedback path being located between the input and output of the associated amplifier means. Each respective alternating current-feedback path for each associated amplifier means comprises a respective inverting coupling amplifier means and alternating current-conductor means connected in circuit between the input and output of the associated amplifier means. At least one of the alternating current-conductor means is externally variable for selectively fulfilling an instability condition for the one or the other of said amplifier means such that there is rendered instable the operating state in which one of said amplifier means is operating and said one amplifier means is caused to assume its other operating state.

14 Claims, 4 Drawing Figures

BISTABLE CONTROLLABLE FLIP-FLOP CIRCUIT

BACKGROUND OF THE INVENTION

The present invention relates to an improved stability controlled flip-flop circuit arrangement.

In the commonly assigned co-pending U.S. application of Theo Stutz, Ser. No. 3,896, filed Jan. 19, 1970, and entitled: "BISTABLE FLIP-FLOP CIRCUIT ARRANGEMENT," there is taught a controllable bistable flip-flop circuit arrangement embodying two amplifiers or two similar amplifier groups, the outputs of which are each connected with the input of the other amplifier through the agency of a respective direct-current coupling path in such a manner that in each of two possible operational conditions or states one of the amplifiers is in its active differentially amplifying state and the other amplifier is in its inactive state. Both amplifiers are provided between their input and their own output with a respective additional feedback path or loop. At least one such feedback path can be changed by altering the value of at least an inductive or capacitive alternating-current impedance with the aid of a movable control body member for selectively fulfilling an instability condition for the one or the other of both amplifiers in a manner that the operating condition in which the relevant amplifier is working in an active amplifying manner is rendered instable and under the influence of the direct-current coupling path is shifted into the other stable operating condition.

Now this development is also concerned with such type circuit arrangement and contemplates improving upon the circuit configurations of the previously mentioned copending application. With the exemplary embodiments of circuitry disclosed in such application the additional feedback paths, apart from containing components of the direct-current coupling paths, also contain for each amplifier passive, inductive and/or capacitive impedances, of which at least one is variable. In consideration of fabricating such flip-flop circuits rationally according to mass production techniques and in an integrated circuit configuration the use of inductive impedances such as coils and transmission means is unfavorable.

SUMMARY OF THE INVENTION

Hence, it is a primary object of the present invention to improve upon the bistable flip-flop circuit configurations taught in the previously mentioned, commonly assigned copending United States application and to render such circuits suitable for mass production techniques, particularly in the form of integrated circuits.

Another and more specific object of the present invention relates to a new and improved flip-flop circuit arrangement which, while maintaining or even in fact improving its favorable operating characteristics, is constructed in such a manner that there are not required any inductive impedances.

Still a further significant object of the present invention relates to a novel stability controlled bistable flip-flop circuit arrangement which is extremely economical to manufacture, particularly suitable for mass-production techniques, and is exceptionally reliable in operation and not readily subject to breakdown or malfunction.

Now in order to implement these and still further objects of the invention, which will become more readily apparent as the description proceeds, the invention contemplates using inverting coupling amplifiers for the alternating current-feedback paths which are additionally associated with the direct-current coupled amplifiers. Each of the inverting coupling amplifiers, in conjunction with an alternating-current conductor or conductor means, is connected between the input and the output of the associated amplifier. At least one of the alternating-current conductors can be externally altered for the purpose of fulfilling the instability condition for the active amplifying state or condition of the one or the other of both amplifiers.

Since an inverting amplifying-coupling amplifier delivers each unavoidable current fluctuation appearing at the output of a self-inverting amplifier to the input of the relevant amplifier with 180° phase rotation, and wherein such is again amplified at the amplifier output with 180° phase rotation, there is provided the precondition for positive feedback of the amplifier and for self-oscillation of the relevant amplifier, as soon as through adjustment of the alternating-current conductor associated with the coupling amplifier to a sufficient conducting value there occurs feedback of the alternating-current fluctuations to the amplifier with a sufficiently great magnitude. Hence, at the alternating-current paths or loops there are not required any inductances for obtaining a phase shift or rotation occurring twice through 180° at the alternating current circuit of each amplifier and also there are not absolutely required capacitors as the alternating-current conductor in that the effective degree of transmission of the feedback amplifier can also be changed by mechanically variable ohmic or complex resistances. The alternating-current conductor in the feedback paths can advantageously be connected in series with the relevant feedback amplifier or also can shunt or bridge such feedback amplifier in the form of a feedback impedance.

Naturally it is advantageous if all of the amplifiers are transistorized. The construction of a flip-flop circuit according to the previously defined concepts of this development then provides the prerequisites for rational mass production techniques in the form of integrated circuit components having a common base substrate for all of the transistors.

A preferred constructional manifestation of flip-flop circuit equipped with transistors as the amplifying elements or amplifiers and as contemplated by the concepts of this development is manifested by the features that the base electrode of each coupling transistor is connected with the collector electrode of the associated transistor amplifier and the collector electrodes of both coupling transistors are directly connected with one another and via a common resistor with one pole of a direct-current voltage source. Further, the emitter electrodes of both coupling transistors are each directly connected with the respective base of the non-associated transistor amplifier. Additionally, a respective capacitor serving as an alternating-current conductor, and wherein at least one such capacitor can be optionally varied, is connected between the connection conductor of the collector electrodes of both coupling transistors and each of the base electrodes of both transistor amplifiers.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
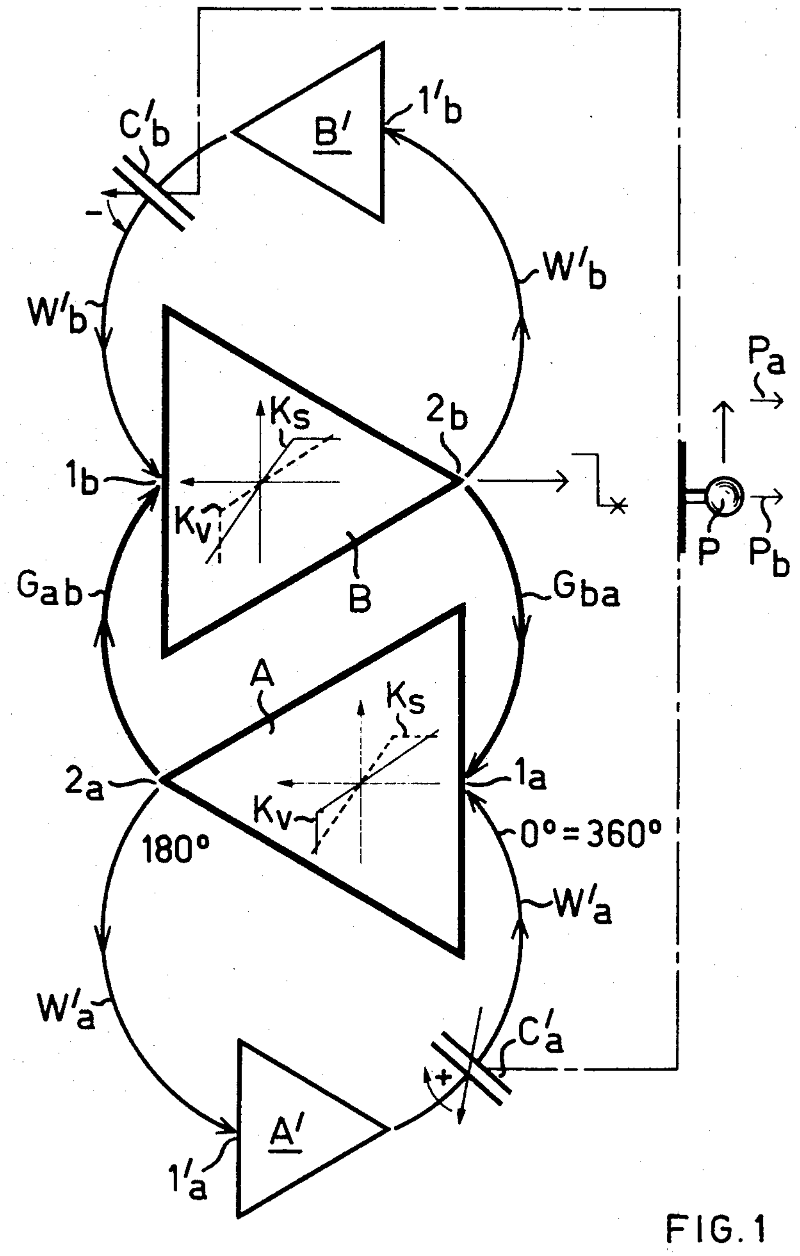
FIG. 1 is a schematic diagram illustrating the basic construction and mode of operation of the inventive flip-flop circuit arrangement.

Describing now the drawings, in FIG. 1 there is schematically illustrated the principals of the basic construction and mode of operation of the inventive flip-flop circuit arrangement, and, more specifically, it will be recognized that two identical inverting transistor amplifiers are represented by reference character A and B respectively. Each such inverting transistor amplifier A and B is provided with a respective input $1_a$ and $1_b$ and a respective output $2_a$ and $2_b$. These amplifiers A and B have been illustrated with the conventional triangular amplifier symbol and further will be recognized to have graphically depicted within the body of each amplifier triangle two respective output-input characteristic lines $K_v$, $K_s$ for each two respective alternately occurring operating states or conditions. In particular, one characterizing line $K_v$ represents the amplifying state or condition and the other characterizing line $K_s$ represents the saturation state or condition.

Continuing, reference characters $G_{ab}$ and $G_{ba}$ represent two direct-current coupling paths, each extending from the output $2_a$ or the output $2_b$ of the one respective amplifier A or B to the other respective amplifier. In this case it will be seen that reference character $G_{ab}$ represents the direct-current coupling path extending from the output $2_a$ of the amplifier A to the input $1_b$ of the other amplifier B, whereas reference character $G_{ba}$ represents the direct-current coupling path extending from the output $2_b$ of the amplifier B to the input $1_a$ of the amplifier A. These direct-current coupling paths ensure that only two operating conditions or states prevail, during which one of the amplifiers, for instance the amplifier A is active, i.e., is driven so as to operate in a differentially amplifying state and the other amplifier, for instance, the amplifier B is inactive, i.e., for instance is driven so as to operate in its saturation range.

An additional inverting amplifier A′ and B′ is operatively associated with each of the amplifiers A and B respectively. These additional inverting amplifiers A′ and B′ are connected as feedback amplifiers into the alternating current-feedback loop or path $W'_a$ and $W'_b$ respectively from the respective output $2_a$ and $2_b$ to the respective input $1_a$ and $1_b$ of the associated amplifiers A and B respectively.

Two variable capacitors $C'_a$ and $C'_b$ form suitable respective alternating-current conductors or conductor means. These capacitors $C'_a$ and $C'_b$ are preferably variable in opposed relationship through mechanical movement of a movable control element or body P out of the illustrated position $P_b$ into the position $P_a$ as schematically indicated in FIG. 1.

As long as the capacitance of the capacitor $C'_b$ is greater than the capacitance of the capacitor $C'_a$, corresponding to the depicted position of the control element or body P, then only one operating condition can be stable in which the transistor amplifier B is driven into its saturation range and the transistor amplifier A into its active amplifying range. If the control element P is adjusted into the position $P_a$ so as to alter such condition, then, the capacitance of the capacitor $C'_b$ becomes smaller than the capacitance of the capacitor $C'_a$. Consequently, the prior operating condition of the transistor amplifier A which previously was operating in its amplifying range becomes instable, and specifically for the following reasons:

Virtual current fluctuations, for instance noise disturbances, of the phase position 180° at the output $2_a$ of the inverting amplifying transistor amplifier A are amplified at the likewise inverting coupling amplifier A′ and fed back, via the capacitor $C'_a$ at the alternating-current coupling path $W'_a$ with sufficient amplitude and with the phase position $360° = 0°$, to the input of the amplifier A. Consequently, there is fulfilled positive alternating-current feedback and therefore an instability condition for the previously amplifying transistor amplifier A. As a result, there is also fulfilled a self-oscillating condition for the amplifier A. However, the oscillation which commences brings about, through the agency of the direct-current coupling paths $G_{ab}$ and $G_{ba}$, an immediate switching condition for the flip-flop circuit arrangement into its second operating state with the amplifier B operating in its amplifying range and the amplifier A being inactive. This condition remains stable until the control element P is returned back into the position $P_b$.

Figure 2:
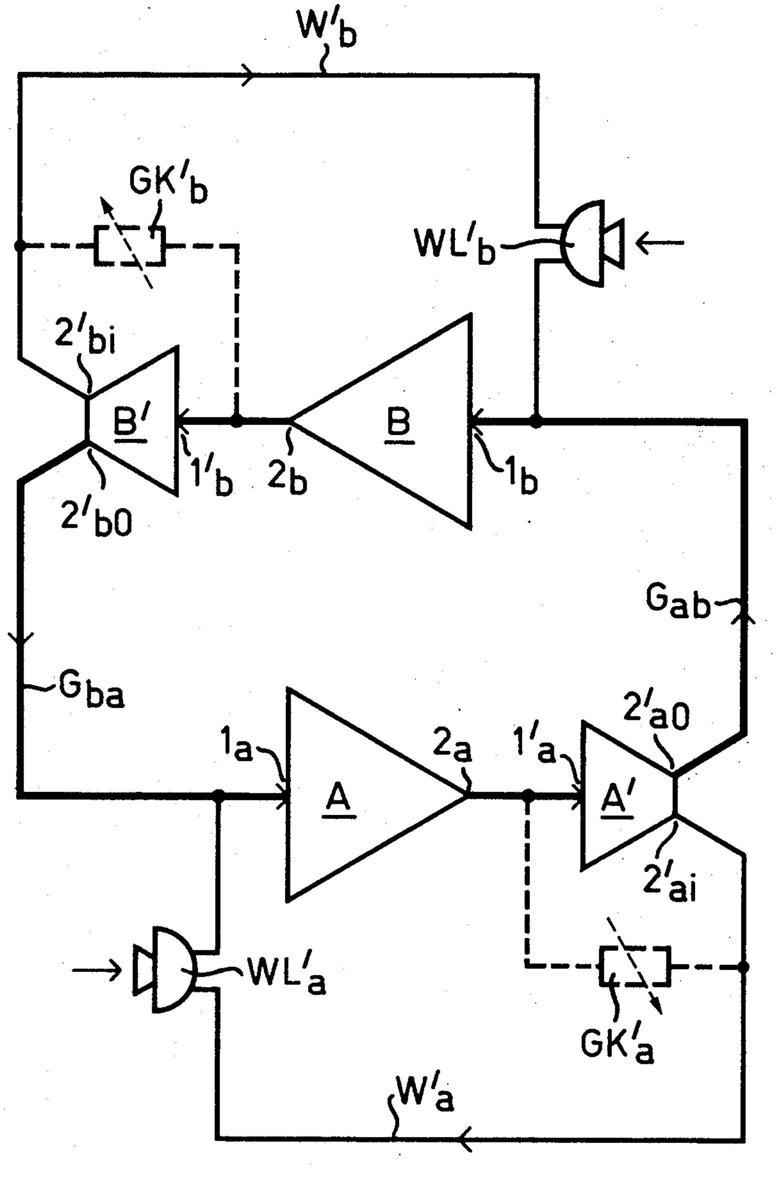
FIG. 2 is a schematic circuit diagram of another embodiment of flip-flop circuit which is a modification of the circuitry of FIG. 1.

Now according to the embodiment of flip-flop circuit configuration as depicted in FIG. 2 the output $2_a$ and $2_b$ of each of both respective amplifiers A and B is connected with the respective input $1'_a$ and $1'_b$ of a respective associated coupling amplifier A′ and B′. Each of those coupling amplifiers A′ and B′ possesses a non-inverting amplifying output $2'_{ao}$ and $2'_{bo}$, for instance formed by the emitter output of such corresponding transistor, as well as also possessing an inverting amplifier output $2'_{ai}$ and $2'_{bi}$, for instance, formed by the collector output of the relevant transistor. The non-inverting outputs $2'_{ao}$ and $2'_{bo}$ of the coupling amplifiers A′ and B′ respectively are connected as direct-current loops or paths $G_{ab}$ and $G_{ba}$ with the inputs $1_b$ and $1_a$ respectively, of the non-associated amplifiers B and A respectively. Further, at these amplifier inputs $1_a$ and $1_b$ there are also connected through the agency of a respective alternating current effective-current conductor $WL'_a$, $WL'_b$ the inverting outputs $2'_{ai}$ and $2'_{bi}$ respectively, of the respective associated coupling amplifiers A′ and B′. Capacitors can be used as suitable electrical components defining the alternating current effective-current conductors $WL'_a$ and $WL'_b$, but it is also possible to use ohmic resistances, or for instance microphone components, which can be influenced by external pressure fluctuations, in order to be able to selectively fulfill for the one or the other of both amplifiers A and B the instability conditions for their active amplifying state.

Also by means of the feedback impedances $GK'_a$ and $GK'_b$ depicted in FIG. 2 in broken lines and which shunt the coupling amplifiers A' and B' respectively, it is possible, if desired, to externally influence the alternating current-transmission mass at the alternating current-coupling paths $W'_a$ and $W'_b$ of the coupling amplifiers A' and B' respectively, in order to bring about the instability condition for the active amplifying state of the one or the other transistor amplifier A and B respectively.

Figure 3:
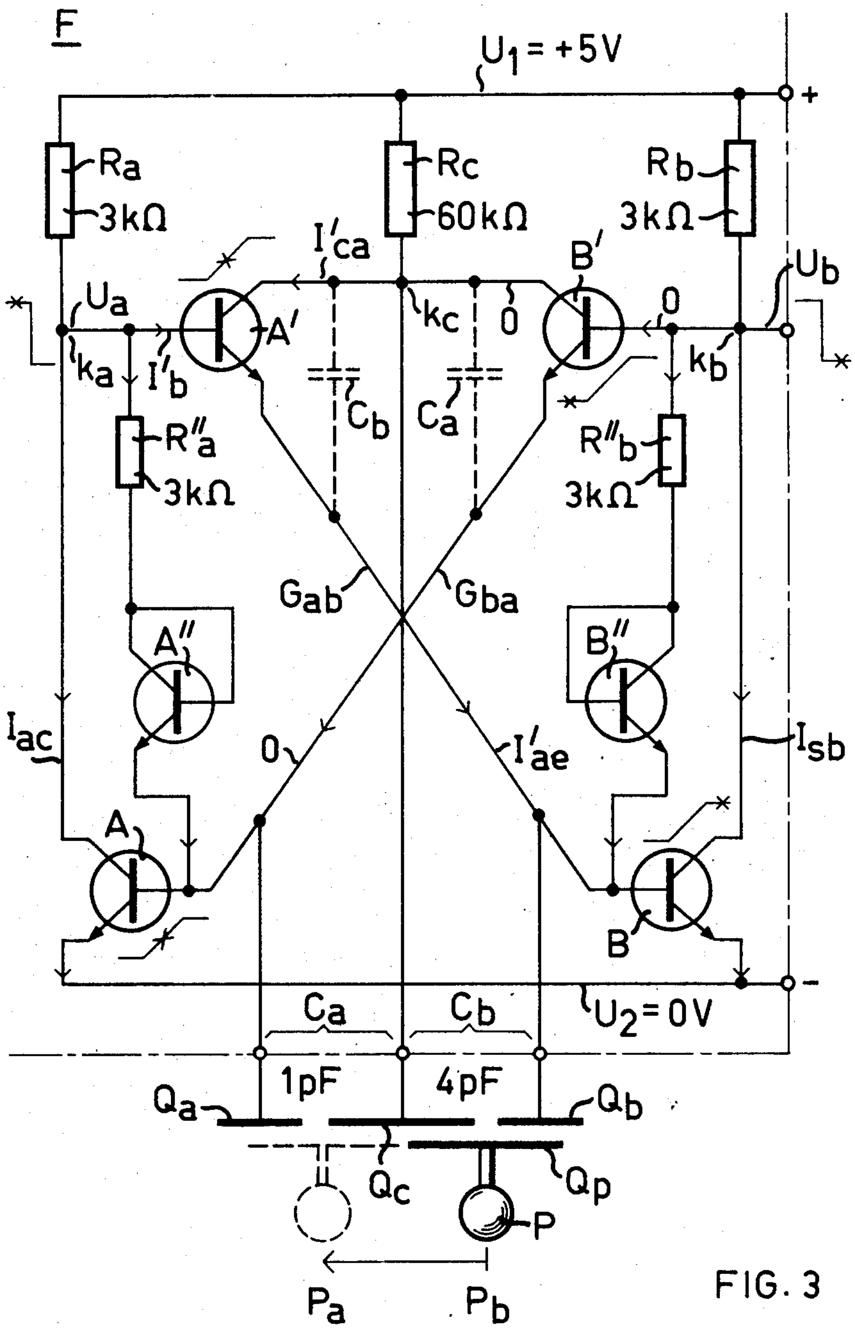
FIG. 3 is a circuit diagram of a preferred embodiment of inventive flip-flop circuit arrangement, particularly suitable for mass production in the form of an integrated circuit and capable of realizing the circuit configurations depicted in FIGS. 1 and 2.

Now in accordance with the circuit configuration depicted in FIG. 3 the transistor amplifiers A and B are each connected by means of their collectors via a respective associated resistor $R_a$ and $R_b$ with the positive pole (+) of a direct-current voltage source. The resistors $R_a$ and $R_b$ each possess a value of approximately 3,000 ohms and the positive pole of the direct-current voltage source can assume a potential $U_1 = +5V$. The emitters of both transistor amplifiers A and B are each directly connected with the negative pole (−), at a potential ($U_2$ = 0 Volts), of the direct-current voltage source.

The bases of the transistor amplifiers A and B are each connected through the agency of an auxiliary transistor A'' and B'', connected into the circuit as diode means, and a resistor $R''_a$ and $R''_b$, respectively, each possessing a value of 3,000 ohms, with the respective connecting terminal or junction $k_a$ and $k_b$ of the corresponding collectors and resistors $R_a$ and $R_b$ of the associated transistor amplifiers A and B respectively. The bases of two coupling transistors A' and B' are also directly connected to the respective terminal of junction point $k_a$ and $k_b$, as shown. The collectors of both of these coupling transistors A' and B' are directly coupled with one another and their junction point $k_c$ is connected through the agency of a common resistor $R_c$, possessing a value of 60,000 ohms, with the positive pole (+) of the direct-current voltage source.

The emitters of the feedback transistors A' and B' are connected through the agency of intersecting direct-current coupling conductors $G_{ab}$ and $G_{ba}$ also directly with the bases of the non-associated transistor amplifiers B and A. Furthermore, the conductors $G_{ba}$ and $G_{ab}$ are each connected with an external capacitor coating or foil $Q_a$ and $Q_b$ respectively, between which there is arranged in a common planar or cylindrical surface a third conductor coating or foil $Q_c$ which is connected with the junction $k_c$ of the collectors of the coupling transistors A' and B'. The common surface of the three capacitor foils $Q_a$, $Q_c$, $Q_b$ has disposed opposite thereto a movable capacitor foil $Q_p$ which can be selectively adjusted into the positions $P_a$ or $P_b$ with the aid of the movable control body or element P. Now in the showing of FIG. 3 the movable foil $Q_p$, i.e., the control element P is located in the position $P_b$. Consequently, the mutual capacitance $C_a$ between the non-bridged or non-shunted foils $Q_a$ and $Q_c$ possesses a minimum value, approximately equal to 1 pF, while the mutual capacitance $C_b$ between the shunted or bridged foils $Q_b$ and $Q_c$ possesses a considerably greater capacitance value, for instance amounting to approximately 3 to 5 pF.

For reasons which will be explained more fully hereinafter this position $P_b$ of the control element P and the movable capacitor foil $Q_p$ automatically corresponds to that operating condition of the flip-flop circuit arrangement F depicted in FIG. 3 in which the transistor amplifier B operates in its saturation range, i.e., in an inactive non-amplifying range, and the transistor amplifier A operates in an active, i.e., differentially amplifying range. Furthermore, in this operating condition the coupling transistor B' operates in its blocking, i.e., inactive range, whereas the feedback transistor A' operates in its active amplifying range. In this operating condition the terminal point $k_b$ at the collector of the transistor amplifier B driven into its saturation range possesses an extremely low positive potential $U_b$, whereas the corresponding terminal $k_a$ at the collector of the actively amplifying transistor amplifier A possesses a considerably greater positive potential $U_a$. These operating conditions of the transistors A and B and also the operating conditions of the coupling transistor A' and B' are represented in FIG. 3 by the symbol (*) placed symbolically at the characteristic lines of the relevant transistor.

It should be apparent from the indicated current direction arrows placed at the infeed lines to or the outfeed lines from the bases, collectors and emitters of the transistors A, B, A', B' that in such transistor circuits the amplified collector current (amplifier outputs) are inverse to the base currents (input currents), whereas the likewise amplified emitter currents are unidirectional with respect to the base currents, in other words not inverted. During the alternating-current operation, i.e., during the superimposing of the current fluctuations at the input current- or base currents the amplified fluctuations appearing at the collector lines are opposite in phase with the input fluctuations and inphase at the emitter lines.

Now if with respect to the circuit configuration of FIG. 3 there is only considered the following coupling paths:

output (collector) from transistor A — terminal point $k_a$ — input (base) of transistor A' — conductor $G_{ab}$ — input (base) of transistor B — output (collector) of transistor B — terminal point $k_b$ - input (base) of transistor B' - conductor $G_{ba}$ - input (base) of transistor A, there then results a DC-coupling schematic analogous to a classical flip-flop circuit arrangement with two amplifiers A, B which are each coupled from the respective output of the one amplifier with the input of the other amplifier through the agency of direct-current loops or paths $G_{ab}$, $G_{ba}$ provided with resistors, instead of via the base-emitter stage of the transistor A', B', and in such a fashion that in each operating condition the one or the other of the amplifiers A, B is driven into its active amplifying range and the other amplifier is driven into its inactive range, for instance into its saturation range. In the classical situation such type flip-flop circuit configuration could be switched into the other operating condition by delivering a control pulse having a predetermined minimum amplitude to one or the other amplifier input.

Now with the inventive circuitry as depicted in FIG. 3 it is not necessary for this purpose to deliver an external control pulse. Quite to the contrary, it is only necessary to move the control element P with the movable capacitor foil or coating $Q_p$ from the one position $P_b$ into the other position $P_a$ and vice versa. If, for instance, according to the showing of FIG. 3 the control element P is displaced out of the illustrated position $P_b$ into the position $P_a$ then the capacitance $C_a$ changes from the prior minimum value, for instance, amounting to 1 pF, to a considerably greater value, for instance in the range of about 3 to 5 pF. Consequently, the AC-conductance value of the capacitance $C_a$ becomes considerably greater and the alternating-current conductance value of the capacitance $C_b$ becomes considerably smaller in relationship to the illustrated values. Always present alternating-current components (noise voltages), for instance at the collector current $I_{ac}$ of the amplifying-driven transistor A, to a certain extent also have an effect upon the base current $I'_b$ of the coupling transistor A' and appear amplified and in an inverse phase position as alternating-current components of the collector current $I'_{ca}$ of the coupling transistor A', i.e., as voltage fluctuations at the terminal or junction $k_c$ which is connected with the foil $Q_c$. The now increased conductance value of the capacitance $C_a$ therefore transfers a sufficiently large proportion of the alternating-current fluctuations appearing at terminal $k_c$ to the input conductor $G_{ba}$ connected with the coating or foil $Q_a$ and leading to the transistor amplifier A and in such a phase position (180°) in which, after inverse amplification at the transistor A, the disturbance fluctuations at the collector current $I_{ac}$ causing this effect are increased. The inverting amplifying base-collector path of the coupling transistor A' thus forms an alternating-current feedback amplifier from the inverting amplifying collector-output of the transistor amplifier A to the own input of such transistor amplifier. Now by means of the increased capacitance $C_a$ a sufficiently large proportion of an alternating-current component is transmitted during positive feedback to the input of the transistor amplifier A such that a self-oscillating condition and instability condition, respectively, is fulfilled for this previously still amplifying transistor amplifier A. Thus, already the first appropriate polarized half-wave of the oscillation thus arising at the transistor A, similar to the effect of a switching pulse delivered externally to the amplifying transistor of a classical flip-flop circuit, automatically switches the transistor A into its saturation state or range.

The corresponding reduction in potential at the terminal $k_a$, i.e., the reduction of the voltage $U_a$, causes a non-inverting increased reduction of the emitter current $I'_{ae}$ at the conductor $G_{ab}$ leading to the transistor B, so that this transistor now is controlled so as to be shifted-out of its saturation range into its amplifying state or range. This brings about a corresponding drop in the collector current in relation to the previously flowing saturation current value $I_{sb}$, and accordingly, a corresponding increase in the output voltage $U_b$ at the terminal $k_b$. Consequently, the previously blocked coupling transistor B', is driven so as to amplify and delivers via the input conductor $G_{ba}$ to the transistor amplifier A an emitter current sufficient to control the transistor amplifier A in its saturation range. Consequently, the voltage $U_a$ appearing at the terminal $k_b$ drops to a lower value, whereby the coupling transistor A' is controlled so as to operate in its blocking or cut-off range and thus becomes ineffectual. In this manner there is obtained the second stable operational condition or state of the flip-flop circuit arrangement wherein the transistors B and B' are driven so as to be actively amplifying and the transistors A and A' are inactive, and this condition remains until the control element P is again adjusted or shifted into the position $P_b$.

In order to ensure for reliable functioning of the flip-flop circuit arrangement depicted in FIG. 3 and to guarantee for a completely symmetrical behavior of the circuitry it is of notable importance that at least the characteristic lines $I^o_c$ ($U_{BE}$), i.e., the dependency of the collector-current density $I^o_c$ upon the base-emitter voltages $U_{BE}$ of both coupling transistors A' and B' and both transistor amplifiers A and B are as equal to one another as possible.

This is then and only then the case with sufficient security when these four transistors A, B, A' and B' are applied as partial or discrete regions of surface layers to a common substrate, in other words, are fabricated according to the known techniques for the mass production of transistor elements.

In this connection attention is also invited to the known equation for transistors which can be expressed as follows:

$$^{U}\mathrm{BE} = U_b \cdot 1n\,(I_c/I_s)$$

$U_{BE}$ = base-emitter voltage
$U_b$ = Boltzmann voltage
$I_c$ = collector current
$I_s$ = saturation current
$1n$ = natural logarithm In this regard it is also indicated that the saturation current $I_s$, with otherwise equal parameters, is approximately proportional to the effective emitter surface of a transistor. In order to prevent that the feedback transistors are not controlled into their saturation range it is advantageous if the effective emitter surfaces of both coupling transistors A' and B' are identical to one another and considerably larger than the likewise identical emitter surfaces of both coupling transistors A and B as well as the auxiliary transistors A'' and B''.

It is advantageous if the entire flip-flop circuit F within the chain-dot illustrated boundaries of FIG. 1 is constructed as an integrated one-piece component with a common base-substrate for all of the transistors.

Figure 4:
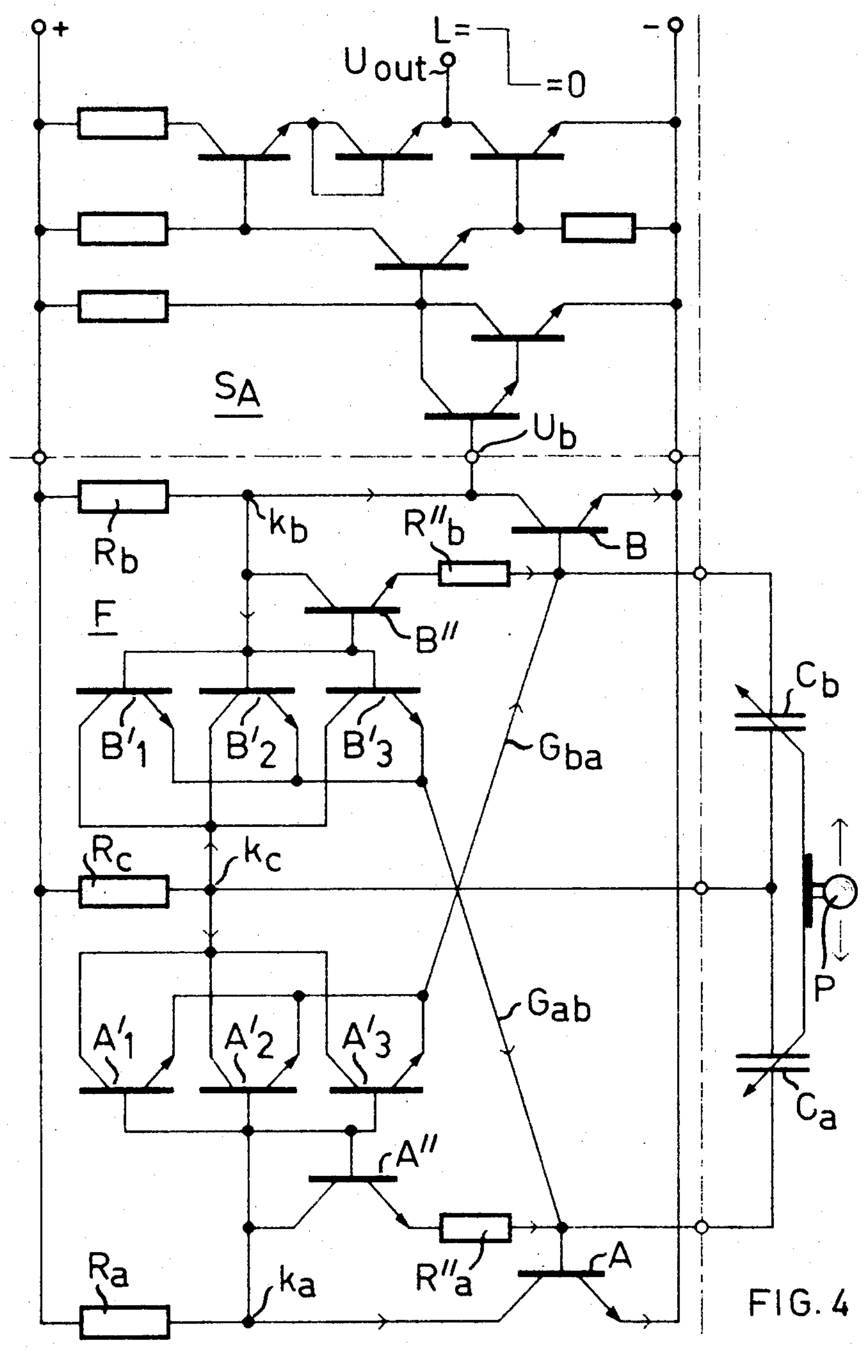
FIG. 4 is a circuit diagram of a further embodiment of flip-flop circuit arrangement constituting a modification to the circuitry of FIG. 3, and here equipped with an additional pulse shaper circuit.

Now for the circuitry of FIG. 4 there have been used the same reference characters for the same or analogous components as shown for the circuit configuration of FIG. 3. Here there is illustrated how it is possible to fulfill the conditions of a large emitter surface of the feedback transistors A' and B' by a respective parallel connection of three transistors $A'_1$, $A'_2$, $A'_3$ and $B'_1$, $B'_2$, $B'_3$ respectively, each of which have the same operating characteristics as the transistor amplifiers A and B and the auxiliary transistors A'' and B''. Additionally, the capacitances $C_a$ and $C_b$ have been depicted as opposing capacitors which can be varied by control element P. In this regard, it would also have been possible to provide that only one of the capacitors $C_a$ or $C_b$ could be variably changed positively and negatively from an average or intermediate value equal to the fixed capacitance of the other capacitor for selectively fulfilling the instability condition $C_a \gtrless C_b$ for the one or other operating condition of the flip-flop circuit configuration F. The output voltage $U_B$ of the flip-flop circuit arrangement F of FIG. 4 is transformed by means of a known converter circuit $S_A$ into a purely binary signal $U_{out}$ with the condition *L* = "*Yes*" *and O* = "*No.*" *Also this converter or transformer circuitry* $S_A$ can be integrated with the circuit arrangement F.

While there is shown and described present preferred embodiments of the invention, it is to be distinctly understood that the invention is not limited thereto but may be otherwise variously embodied and practiced within the scope of the following claims. Accordingly,

What is claimed is:

1. A bistable controllable flip-flop circuit arrangement comprising two amplifier means each having an input and an output, means providing a respective direct current-coupling path for connecting the output of each amplifier means with the input of the other amplifier means in such a manner that in each of two possible operating conditions one amplifier means assumes an active amplifying state and the other amplifier means assumes an inactive non-amplifying state, means providing a respective alternating current-feedback path for each of said amplifier means, each said alternating current-feedback path being located between the input and output of the associated amplifier means, said means providing a respective alternating current-feedback path for each associated amplifier means comprising a respective inverting coupling amplifier means and alternating current-conductor means connected in circuit between the input and output of the associated amplifier means, at least one of said alternating current-conductor means being externally variable for selectively fulfilling an instability condition for the one or the other of said amplifier means such that there is rendered instable the operating state in which one of said amplifier means is operating and causes said one amplifier means to assume its other operating state.

2. The bistable controllable flip-flop circuit arrangement as defined in claim 1, further including a movable control body for changing the value of said at least one alternating current-conductor means.

3. The bistable controllable flip-flop circuit arrangement as defined in claim 1, wherein each of said alternating current-conductor means is externally variable.

4. The bistable controllable flip-flop circuit arrangement as defined in claim 3, further including a movable control body for selectively varying each of said alternating current-conductor means.

5. The bistable controllable flip-flop circuit arrangement as defined in claim 1, wherein each said amplifier means comprises an amplifier transistor and each of said inverting coupling amplifier means comprises an inverting coupling transistor, each of said transistors having a base electrode, collector electrode and emitter electrode, a direct current-voltage source, means for connecting the base electrode of each inverting coupling transistor with the collector electrode of a respective associated amplifier transistor of said amplifier means, means for connecting the collector electrodes of both coupling transistors directly with one another and via a common resistor with one pole of said direct current-voltage source, means for connecting the respective emitter electrode of each of both coupling transistors directly with the base electrode of the non-associated transistor amplifier, and a respective capacitor serving as each said alternating current-conductor means connected between a common terminal of the collector electrodes of both said inverting coupling transistors and the the base electrode of its associated transistor amplifier, at least one of said capacitors being randomly variable.

6. The bistable controllable flip-flop circuit arrangement as defined in claim 5, further including a respective resistor means for coupling the base electrode of each amplifier transistor with the collector electrode of the same amplifier transistor.

7. The bistable controllable flip-flop circuit arrangement as defined in claim 6, further including a respective diode means and auxiliary transistor connected in a diode circuit arrangement in series with each said resistor means between the collector electrode and base electrode of each amplifier transistor.

8. The bistable controllable flip-flop circuit arrangement as defined in claim 5, wherein the current density-characteristic lines of at least both amplifier transistors and both inverting coupling transistors are approximately equal to one another, and wherein at least the active emitter surfaces of both inverting coupling transistors are considerably larger than the active emitter surfaces of both amplifier transistors.

9. The bistable controllable flip-flop circuit arrangement as defined in claim 1, wherein each of said inverting coupling amplifier means having an input, means for connecting the input of each inverting coupling amplifier means with the output of the associated amplifier means, and a respective one of said alternating current-conductor means connecting each inverting coupling amplifier means with the input of the associated amplifier means.

10. The bistable controllable flip-flop circuit arrangement as defined in claim 9, wherein said inverting coupling amplifier means each possess a non-inverting output, means for connecting the non-inverting output of each inverting coupling amplifier means with the input of the non-associated amplifier means, said inverting coupling amplifier means feeding both the alternating current-feedback path for the associated amplifier means as well as the direct current-coupling path of the non-associated amplifier means.

11. The bistable controllable flip-flop circuit arrangement as defined in claim 9, wherein each said alternating current-conductor means at the alternating current-feedback path of the associated amplifier means comprises a microphone device which can be influenced by external pressure changes.

12. The bistable controllable flip-flop circuit arrangement as defined in claim 11, further including feedback impedances for bridging each said inverting coupling amplifier means.

13. The bistable controllable flip-flop circuit arrangement as defined in claim 12, wherein at least one of said feed-back impedances for said inverting coupling amplifier means can be optionally varied in order to influence the alternating-current transmission mass at the alternating current-feedback path and thus to fulfill the instability condition for the amplifying operating state of the one or the other of said amplifier means.

14. A bistable controllable flip-flop circuit arrangement, comprising two amplifier means each having an output and an input, means defining a respective direct-current coupling path for coupling the respective output of each amplifier means with the input of the other amplifier means in such a manner that in each of both operating conditions one of both amplifier means assumes an active amplifying state and the other of both amplifier means is driven into an inactive non-amplifying state, means defining a respective alternating current-feedback path incorporating an alternating current-conductor means and an inverting coupling amplifier means arranged in circuit with an associated one of said amplifier means between its own input and output, and a movable control body for changing the value of at least one of said alternating current-conductor means such that selectively for the one or the other of both amplifier means a positive alternating current-feedback condition is fulfilled between its output and its input which renders unstable the amplifying state in which the relevant amplifier is functioning and switches such amplifier means into its other operating state.

* * * * *